(12) United States Patent
Swaim et al.

(10) Patent No.: US 11,119,120 B2
(45) Date of Patent: Sep. 14, 2021

(54) POWER PROBE INCLUDING SENSOR FOR DETECTING CURRENT AND VOLTAGE SIGNALS

(71) Applicant: Keysight Technologies, Inc., Santa Rosa, CA (US)

(72) Inventors: Jason Swaim, Colorado Springs, CO (US); Edward Vernon Brush, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 103 days.

(21) Appl. No.: 16/555,894

(22) Filed: Aug. 29, 2019

(65) Prior Publication Data
US 2021/0063440 A1 Mar. 4, 2021

(51) Int. Cl.
*G01R 19/25* (2006.01)
*G01R 1/067* (2006.01)
(Continued)

(52) U.S. Cl.
CPC ......... *G01R 1/06766* (2013.01); *G01R 19/25* (2013.01); *G01R 21/06* (2013.01); *G01R 21/133* (2013.01); *G01R 1/06794* (2013.01)

(58) Field of Classification Search
CPC .............. G01R 35/005; G01R 1/06788; G01R 1/06766; G01R 19/25; G01R 21/133; G01R 21/06; G01R 1/06794; G01R 27/28; G01R 1/06772; G01R 31/3191; G01R 31/67; G01R 13/345; G01R 35/002;
(Continued)

(56) References Cited

U.S. PATENT DOCUMENTS

| 4,635,256 A | * | 1/1987 | Herlein | ............ | G01R 31/31713 |
| | | | | | 714/700 |
| 4,806,852 A | * | 2/1989 | Swan | ................. | G01R 31/3191 |
| | | | | | 324/73.1 |

(Continued)

FOREIGN PATENT DOCUMENTS

| CN | 108152575 A | 6/2018 |
| CN | 208026785 U | 10/2018 |

OTHER PUBLICATIONS

English translation of CN108152575, dated Jun. 12, 2018, 23 pgs.
(Continued)

*Primary Examiner* — Vinh P Nguyen

(57) ABSTRACT

A probe is connectable to a test instrument for measuring signals of a DUT, where the probe includes a probe head that includes multiple leads configured to connect to signal probe points of the DUT, and a sensor connected between two of the leads; at least one probe output configured to connect to the test instrument; a current detection circuit configured to detect current of the DUT through the sensor, and to provide a detected current signal; a voltage detection circuit configured to detect voltage of the DUT between the sensor and ground, and to provide a detected voltage signal; a combiner configured to combine the detected current signal and the detected voltage signal, and to provide a power signal indicating power of the DUT; and switches configured to selectively output at least one of the detected current signal, the detected voltage signal, and the power signal.

20 Claims, 6 Drawing Sheets

(51) Int. Cl.
*G01R 21/06* (2006.01)
*G01R 21/133* (2006.01)

(58) Field of Classification Search
CPC ............ G01R 13/0254; G01R 13/0272; G01R 13/029; G01R 1/24; G01R 27/04; G01R 31/31716; G01R 31/31905; G01R 33/60; G01R 35/007; G01R 31/00; G01R 31/31922; G11C 29/023; G11C 29/028; G11C 7/10; G11C 29/022; G06F 13/4022; G06F 13/4291; G06F 1/3296; G06F 13/4068; G06F 12/0866; H04L 7/0037; H04L 25/028; H04L 25/0292; H04L 43/0852; H03K 2005/00065; H03K 5/00006; H03K 5/135; H04J 3/0682
See application file for complete search history.

(56) References Cited

U.S. PATENT DOCUMENTS

| | | | | |
|---|---|---|---|---|
| 5,289,116 | A * | 2/1994 | Kurita | G01R 31/3167 |
| | | | | 324/73.1 |
| 7,408,363 | B2 * | 8/2008 | Tan | G01R 35/005 |
| | | | | 324/601 |
| 7,463,015 | B2 * | 12/2008 | Mende | G01R 1/06772 |
| | | | | 324/754.01 |
| 9,188,606 | B2 | 11/2015 | Johnson et al. | |
| 9,297,846 | B2 * | 3/2016 | Vulovic | G01R 31/52 |
| 10,359,450 | B1 * | 7/2019 | Oliva | G01R 1/30 |
| 2019/0033349 | A1 | 1/2019 | Michna et al. | |
| 2019/0064233 | A1 | 2/2019 | Grimm | |

OTHER PUBLICATIONS

English translation of CN208026785, dated Oct. 30, 2018, 17 pgs.
Chinese Decision to Grant dated Jul. 23, 2021, application No. 202021831947.4 with English translation, 4 pgs.

* cited by examiner

POWER PROBE INCLUDING SENSOR FOR DETECTING CURRENT AND VOLTAGE SIGNALS

BACKGROUND

Test instruments are able to measure voltage of a device under test (DUT) using a conventional voltage probe and current using a conventional current probe. Ideally, the voltage and current probes would measure the voltage and current at the same physical location on the DUT, although as a practical matter, the physical locations differ due to size and shape constraints, for example. Distance between the actual physical locations, as well as differences in electrical lengths of probes, result in skew error between the voltage and current measurements. In order determine power of the DUT, the measured voltage and current may be mathematically multiplied (P=I*V), assuming there is no skew error. Such power determination may be performed using a variety of conventional test and measurement equipment, such as an N7026A AC/DC high sensitivity clamp-on current probe on a wire in a DUT circuit and an N2872A passive probe for voltage potential on a wire referenced to ground, both devices available from Keysight Technologies, Inc.

Some test instruments have multiple inputs that may measure voltage or current, such as power analyzers. The software in these types of instruments is able to multiply the voltage and current measurements, although such test instruments are typically slow, and offer limited bandwidth. Also, the voltage and current measurements are still subject to skew error. In some test instruments, such as a digital voltage meter (DVM), the voltage and current measurements, and thus the resulting power determinations, are discrete in time and therefore are not conducive for time domain measurements.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
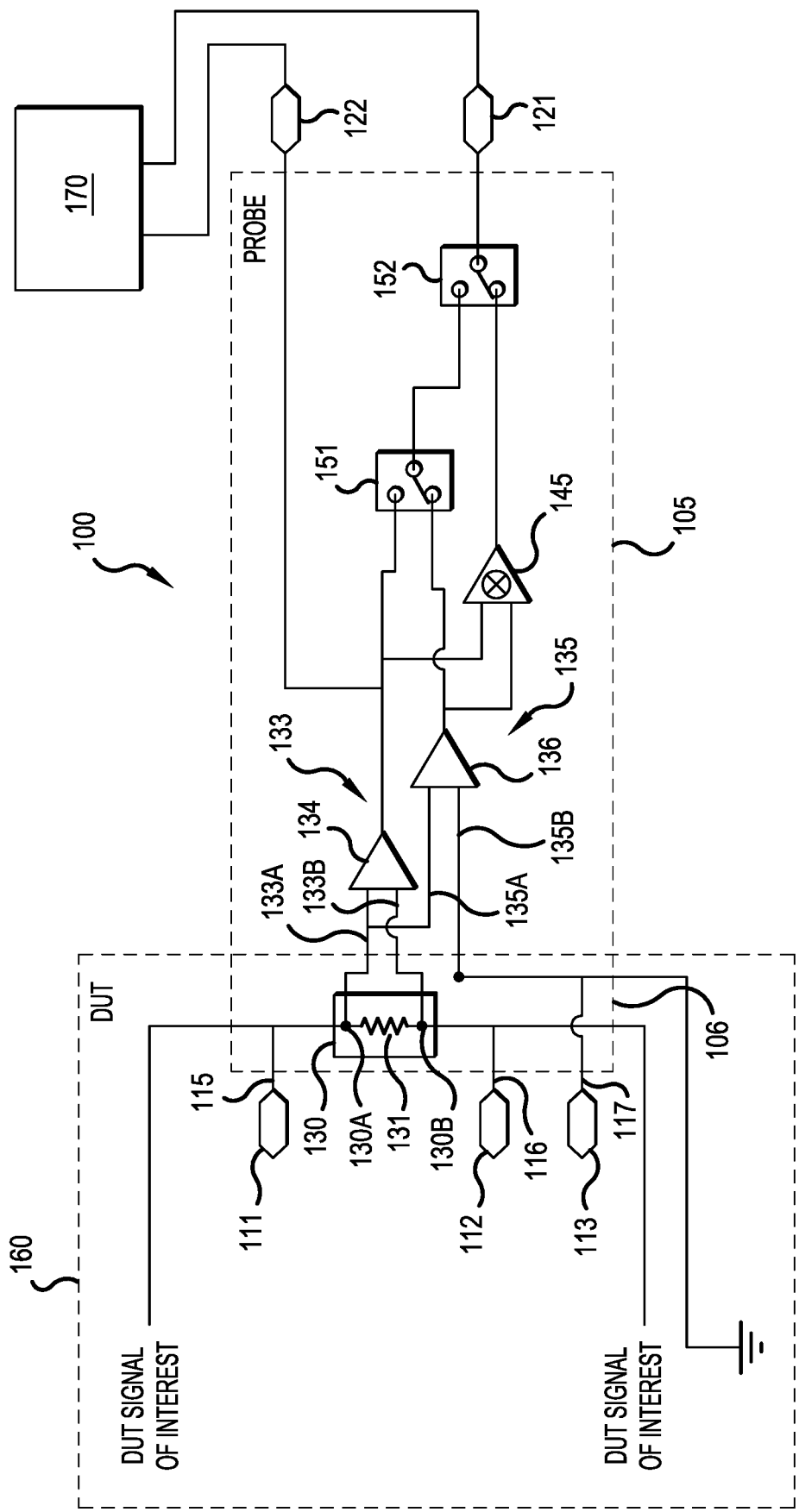
FIG. 1 is a simplified block diagram of a probe connectable to a test instrument for measuring signals of a device under test (DUT), according to a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element is said to be connected to a second element, this encompasses cases where one or more intermediate elements may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if an apparatus (e.g., a signal measurement device) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

According to various embodiments, a power probe is provided for use with an oscilloscope or other time-domain test instrument. The power probe measures simultaneously current and voltage waveforms at a particular circuit location of a DUT, and is able to output the resulting power waveform and/or the current or voltage portions of power independently.

FIG. 1 is a simplified block diagram of a probe connectable to a test instrument for measuring signals of a DUT, according to a representative embodiment.

Referring FIG. 1, a probe 100 is connectable between a DUT 160 and a test instrument 170 for measuring and displaying signals of the DUT 160. The test instrument 170 may be an oscilloscope, a power analyzer or a spectrum analyzer, for example, although the test instrument may be any device or system capable of determining and displaying current, voltage and/or power of the DUT 160 based on probe input, without departing from the scope of the present teachings. The test instrument 170 may operate in the time domain, enabling the collection and display of the current, the voltage and/or the power over a period of time. The probe 100 and the test instrument 170 connected together may be referred to as a probe system.

The probe 100 includes a base 105 and a probe head 106. In alternative embodiments, the probe head 106 may be permanently connected to (integrated with) the base 105 or removably connected to the base 105. When the probe head 106 is removably connected to the base 105, the probe head 106 may be selected to accommodate different geometries of the DUT 160 and/or different performance requirements of the DUT 160. Then, the probe head 106 may be replaced with another probe head associated with geometries and/or performance requirements of another DUT. When removably connected, the probe head 106 may be include any type of compatible connectors for connecting to the circuitry of the base 105 (e.g., current detection circuit 133 and voltage detection circuit 135, discussed below), such as subminiature version A (SMA) connectors, micro coaxial connector (MCX) connectors, micro-miniature coaxial (MMCX) connectors, or custom coaxial or non-coaxial connectors, for example.

The probe 100 includes three probe inputs for connecting to the DUT 160. The probe inputs include a first probe input 111 that provides high side current and high side voltage, a second probe input that provides low side current, and a third probe input 113 that connects to ground. In the depicted embodiment, the third probe input 113 connects to ground of the DUT 160, although the third probe input 113 may connect to ground outside the DUT 160, without departing from the scope of the present teachings. The first and second probe inputs 111 and 112 are configured to signal probe points (not shown) in the DUT 160, for example, by touching the first and second probe inputs 111 and 112 to the signal probe points or fixing (e.g., soldering) the first and second probe inputs 111 and 112 to the signal probe points for the duration of the measurements. Alternatively, a user may break a wire/trace in the DUT 160, and connect the first and second probe inputs 111 and 112 to the broken wire/trace, effectively routing it through the probe 100. The first probe input 111 is connected to the probe head 106 by first signal lead 115, the second probe input 112 is connected to the probe head 106 by second signal lead 116, and the third probe input 113 is connected to the probe head 106 by ground lead 117. The first and second signal leads 115 and 116 and the ground lead 117 are flexible, and may be provided in various lengths to facilitate connections to the signal probe points and ground of the DUT 160. To maximize performance, first and second signal leads 115 and 116 and the ground lead 117 should each be as short as possible.

The probe 100 also includes two probe outputs for connecting to the test instrument 170. In the depicted embodiment, the probe outputs include first (primary) probe output 121 and second (optional) probe output 122. The first and second probe outputs 121 and 122 may output various combinations of a detected current signal, a detected voltage signal and a power signal provided by the probe 100. In the depicted embodiment, the detected current signal is a voltage signal corresponding to DUT current detected by a current detection circuit 133, the detected voltage signal is a voltage signal corresponding to DUT voltage detected by a voltage detection circuit 135, and the power signal is a voltage signal corresponding to DUT power provided by a combiner 145. The test instrument 170 receives information from the probe 100 that indicates what each of the voltages of the detected current signal, the detected voltage signal and the power signal represents, as well as the corresponding units/scaling, which may be applied to the data for storage and/or display.

The first probe output 121 is configured to selectively output one of the detected voltage signal, the detected current signal or the power signal via operation of a first output switch 141 and a second output switch 142, discussed below. The second probe output 122 is hard wired to output one of the detected voltage signal, the detected current signal or the power signal, depending on design requirements. For example, in the depicted embodiment, the second probe output 122 is directly connected to the current detection circuit 133, and thus is capable of outputting only the detected current signals. In alternative embodiments, the second probe output 122 may be connected to the voltage detection circuit 135 for outputting only the detected voltage signals, or to an output of the combiner 145 for outputting only the power signals, without departing from the scope of the present teachings. The first and second probe outputs 121 and 122 are connected to corresponding channels of the test instrument 170 via wired connections (e.g., cables), in order to pass one or more of the voltage signal, current signal and power signal to the test instrument 170 for processing and/or display.

In addition, the probe 100 includes a sensor 130 connected to each of the first and second probe inputs 111 and 112 for detecting current and voltage at the signal probe points of the DUT 160. In particular, the first probe input 111 is connected to a first node 130A of the sensor 130, and the second probe input 112 is connected to a second node 130B of the sensor 130, while the third probe input 113 is connected to the DUT ground. In an embodiment, one of the first and second nodes 130A and 130B may be connected to ground, in which case only two physical connections to the DUT 160 are required for detecting current and voltage. The sensor 130 is in the probe head 106, and is therefore removable along with the probe head 106 when the probe head 106 is removably connected to the base 105.

In the depicted embodiment, the sensor 130 includes a resistor 131 through which DUT current passes between the first and second probe inputs 111 and 112 for detecting the current and voltage, and providing current and voltage signals. The value of the resistor 131 may be based on optimizing a maximum burden voltage in the circuit of the DUT 160 and desired measurement sensitivity. For example, a larger valued resistor is more disruptive to the DUT circuit, but leads to larger and more easily measured voltage drops. Also, the resistor 131 may be a coaxial shunt, which is essentially a sense resistor constructed in a coaxial manner. The coaxial construction helps to isolate the current loops or the DUT 160 and the probe 100 from one another, which reduces noise and allows for greater bandwidth. Alternatively, the sensor 130 may include other components for detecting the current and voltage, such as a current transformer or a Hall effect sensor, for example, without departing from the scope of the present teachings. Also, in an embodiment, the sensor 130 may be located in the DUT 160, in which case the first and second probe inputs 111 and 112 would contact the first and second nodes 130A and 130B in order to detect current and voltage of the DUT 160.

The sensor 130 is connected to the current detection circuit 133 and the voltage detection circuit 135, mentioned above. The current detection circuit 133 includes a first lead 133A connected to the first node 130A of the sensor 130, and a second lead 133B connected to the second node 130B of the sensor 130, such that the current detection circuit 133 is able to detect current passing through the resistor 131 and provide a corresponding detected current signal. Typically, current is detected indirectly by the sensor 130, so the detected current signal itself may be a voltage that corresponds to the detected current from the sensor 130. The current detection circuit 133 further includes first amplifier 134, which may be a differential amplifier with inputs connected to the first and second leads 133A and 133B, respectively, in order amplify the detected current signal. Similarly, the voltage detection circuit 135 includes a first lead 135A connected to the first node 130A of the sensor 130, and a second lead 135B connected to ground through the third probe input 113, such that the voltage detection circuit 135 is able to detect voltage between the high side of the resistor 131 and ground and provide a corresponding detected voltage signal. Alternatively, the first lead 135A may be connected to the second node 130B to detect the voltage between the low side of the resistor 131 and ground. Also, the probe 100 may support electronic switching between the first node 130A (or the second node 130B) and ground. The voltage detection circuit 135 further includes a second amplifier 136, which may be a differential amplifier with inputs connected to the first and second leads 135A and 135B, respectively, in order amplify the detected voltage signal.

The current detection circuit 133 may perform a discrete current measurement or a continuous current measurement over time, in which case the detected current signal is correlated with time. Likewise, the voltage detection circuit 135 may perform a discrete voltage measurement or a continuous voltage measurement over time, in which case the detected voltage signal is correlated with time. When the current and/or voltage measurements are continuous, the channels of the test instrument 170 sample the detected current signal and/or the detected voltage signal in small, very accurate time intervals. The timing between the channels in the test instrument 170 is well controlled and calibrated, effectively preventing timing error within the test instrument 170. Thus, the only skew that would likely occur is between the current detection circuit 133 and the voltage detection circuit 135, which may be addressed internally by the probe 100, as discussed below.

The probe 100 includes a combiner 145 that combines (multiplies) the detected current signal output from the current detection circuit 133 (at the output of the first amplifier 134) and the detected voltage signal output from the voltage detection circuit 135 (at the output of the second amplifier 136) to provide a power signal indicating power of the DUT 160. In the depicted embodiment, the combiner 145 is a differential amplifier with a first input connected to the current detection circuit 133 to receive the detected current signal, and a second input connected to the voltage detection circuit 135 to receive the detected voltage signal. In alternative embodiments, the combiner 145 may be implemented as a multiplexer or an internal processing unit (not shown) located in the probe 100, for example, without departing from the scope of the present teachings. In an embodiment, each of the first amplifier 134, the second amplifier 136, and the combining amplifier/combiner 145 is a high bandwidth amplifier, which enables measurement of detected current signals and detected voltage signals having bandwidths greater than 100 MHz and/or signal content greater than 100 MHz, for example.

A selection circuit of the probe 100 is controlled to determine which signal(s) are output at the first probe output 121. That is, a first switch 151 has two inputs connected to the output of the current detection circuit 133 and the voltage detection circuit 135, respectively. The first switch 151 is configured to select one of the detected current signal from the current detection circuit 133 and the detected voltage signal from the voltage detection circuit 135 by operation of a single pole, double throw switch, for example. A second switch 152 has two inputs connected to the output of the first switch 151 and the output of the combiner 145, respectively. The second switch 152 is configured to select one of the detected current signal/detected voltage signal from the first switch 151 and the power signal from the from the combiner 145 by operation of a single pole, double throw switch, for example. The selected one of the detected current signal/detected voltage signal and the power signal is output from the probe 100 through the first probe output 121. For example, when each of the first switch 151 and the second switch 152 is in a first (up) position, the detected current signal is output at the first probe output 121. When the first switch 151 is in a second (down) position and the second switch 152 is in the first (up) position, the detected voltage signal is output at the first probe output 121. When the second switch 152 is in a second (down) position, the power signal is output at the first probe output 121, regardless of the position of the first switch 151.

Meanwhile, as mentioned above, the second probe output 122 is hardwired to the output of the current detection circuit 133, and therefore outputs only the detected current signal. In alternative embodiments, the second probe output 122 may be hardwired to the output of the voltage detection circuit 135 or to the output of the combiner 145, and would therefore output only the detected voltage signal or the power signal, respectively. Also, in an alternative embodiment, another set of two switches in the same arrangement as the first and second switches 151 and 152 may be connected to the second probe output 122, in which case the second probe output 122 would likewise be able to selectively output one of the detected current signal, the detected voltage signal, and the power signal, in substantially the same manner as discussed above with regard to the first and second switches 151 and 152 and the first probe output 121. Generally, the first and second probe outputs 121 and 122 enable simultaneous measurement of the detected current and the detected voltage, as well as the power, in a single-shot event situation.

In an embodiment, the first and/or second switches 151 and 152 may be operated manually, for example, by external controls on the probe 100. In an alternative embodiment, the first and/or second switches 151 and 152 may be operated through a controller or a processing unit (not shown), for example, located in the probe 100 or in the test instrument 170. When the controller or processing unit is located in the probe 100, in controls operation of the first and/or second switches 151 and 152 in response to user input provided by an interface on the probe 100, such as a button, a switch or other physical controller on the probe body, for example. When the controller or processing unit is located in the test instrument, an additional electrical connection (wired or wireless) is made between the probe 100 and the test instrument 170 to enable communication of control signals to the first and/or second switches 151 and 152.

A processing unit (or controller), as used herein, may include one or more field programmable gate arrays (FPGAs), application specific integrated circuits (ASICs), digital signal processors (DSPs), microprocessors, computer processors, or combinations thereof, using any combination of hardware, software, firmware, hard-wired logic circuits, or combinations thereof. The processing unit may include its own memory (e.g., volatile and/or nonvolatile memory) for storing software instructions and/or computer readable code that enables performance of the various functions described herein. For example, the memory may store software instructions/computer readable code executable by the processing unit (e.g., computer processor) for performing some or all aspects of functions and methods described herein.

The memory may be implemented by any number, type and combination of random access memory (RAM) and read-only memory (ROM), for example, and may store various types of information, such as software algorithms and computer programs executable by the processing unit. The various types of ROM and RAM may include any number, type and combination of computer readable storage media, such as a disk drive, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art, which are tangible and non-transitory storage media (e.g., as compared to transitory propagating signals).

The processing unit may further include a user interface for providing information and data to the user and/or for receiving information and data from the user. That is, the user interface enables the user to enter data and to control or manipulate aspects of the probe 100, such as operation of the first and second switches 151 and 152, and control of deskew circuits (discussed below), for example, and also enables the processing unit to indicate the effects of the user's control or manipulation. The user interface may provide information and data to the user via a display, which may include a graphical user interface. The user interface may receive information and data from the user via one or more of a keyboard, a mouse, a trackball, a joystick, a touchpad, and a touch screen, for example.

Having both the current detection circuit 133 and the voltage detection circuit 135 integrated into a single probe 100 minimizes or reduces overall size of the probing solution, which otherwise includes multiple probes. For example, separate current and voltage probes require four wires (two wires per probe) for connecting to DUT circuitry. Therefore, by combining the current and voltage detection functions into a single probe 100 with a common ground wire (e.g., the third probe input 113 and the ground lead 117), only three wires are required for connecting to the DUT circuitry. This is a twenty-five percent size reduction in wires alone. Also, many electronic devices (e.g., DUT 160) that are subject to testing generally are getting smaller, and thus the relatively small first and second probe inputs 111 and 112, and corresponding first and second signal leads 115 and 116, of the single probe 100 are better able to contact the probe points in the DUT 160, as compared to conventional large, bulky probes. The smaller geometry of the first and second probe inputs 111 and 112 and the first and second signal leads 115 and 116 also leads to higher bandwidth performance of the probe 100.

Further, by integrating the current detection circuit 133 and the voltage detection circuit 135 into the single probe 100, e.g., along with the ability to produce a power output signal, minimizes or reduces the number of channels required of the test instrument 170 (e.g., an oscilloscope). For example, one power channel may be used to receive the power signal output by the probe 100, as opposed to having to use separate current and voltage channels to receive the detected current and voltage signals, and then calculate power of the DUT 160 at the test instrument 170, which is the case when separate current and voltage probes are used. The increased availability of channels allows more power signals to be measured by the test instrument 170 with a fixed number of channels. The probe 100 and the test instrument 170 can switch among displaying current, voltage and power using electronic or software controls. That is, there is no need for the user to disconnect or reconfigure accessories/connections manually in order to obtain and display the different signals at the test instrument 170. Also, the probe 100 is able to work with traditional real-time oscilloscopes as the test instrument 170, for example, which allow very high bandwidth power measurements as compared to power analyzers and other DC/slow test instruments.

As mentioned above, in alternative embodiments, the sensor 130 may be implemented using component(s) other than a resistor. In this regard, FIG. 2A is a simplified block diagram of a sensor implemented using a current transformer, and FIG. 2B is a simplified block diagram of a sensor implemented using a Hall effect sensor, according to representative embodiments.

Figure 2A:
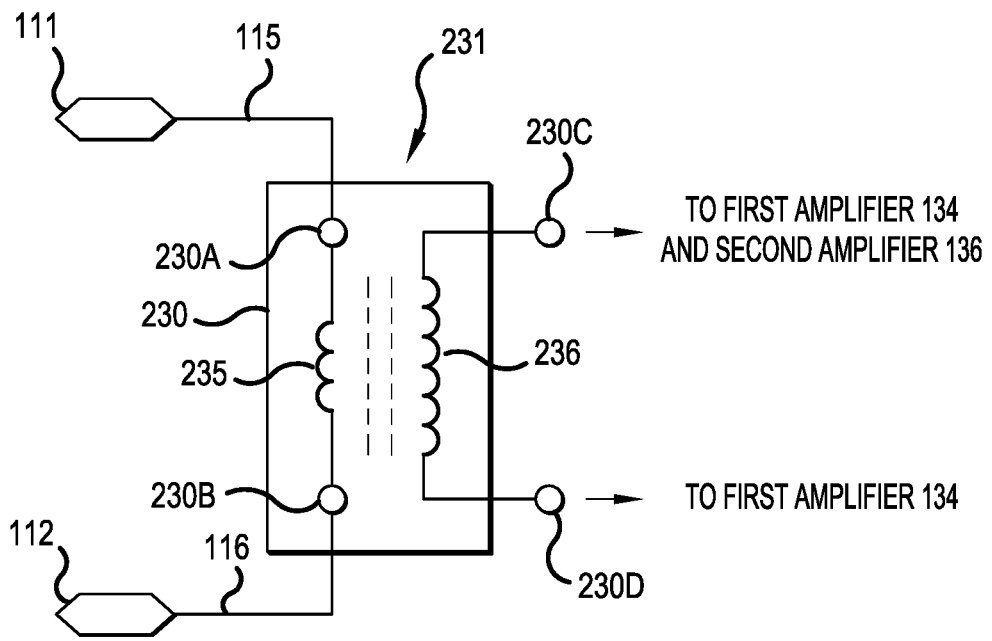
FIG. 2A is a simplified block diagram of a sensor implemented using a current transformer, according to a representative embodiment.

Referring to FIG. 2A, a sensor 230 includes a current transformer 231, having a primary winding 235 and a secondary winding 238. The primary winding 235 is connected between first node 230A and second node 230B, and the secondary winding 238 is connected between third node 230C and fourth node 230D of the sensor 230 on the probe head 106. The first probe input 111 is connected to the first node 230A via the first signal lead 115, and the second probe input 112 is connected to the second node 230B via the second signal lead 116, such that current from the DUT 160 flows through the primary winding 235, which induces current flow (the detected current) in the secondary winding 238. The third node 230C connects to the first amplifier 134 and the second amplifier 136, and the fourth node 230D connects to the first amplifier 134, to provide detected current and detected voltage signals, as discussed above. In addition to detecting current, the current transformer 231 also provides isolation and/or reduces the burden loading, as compared to a resistor (e.g., resistor 131), although there is no DC measurement with the current transformer 231. A coaxial shunt may be used to maximize broadband (including DC) performance.

Figure 2B:
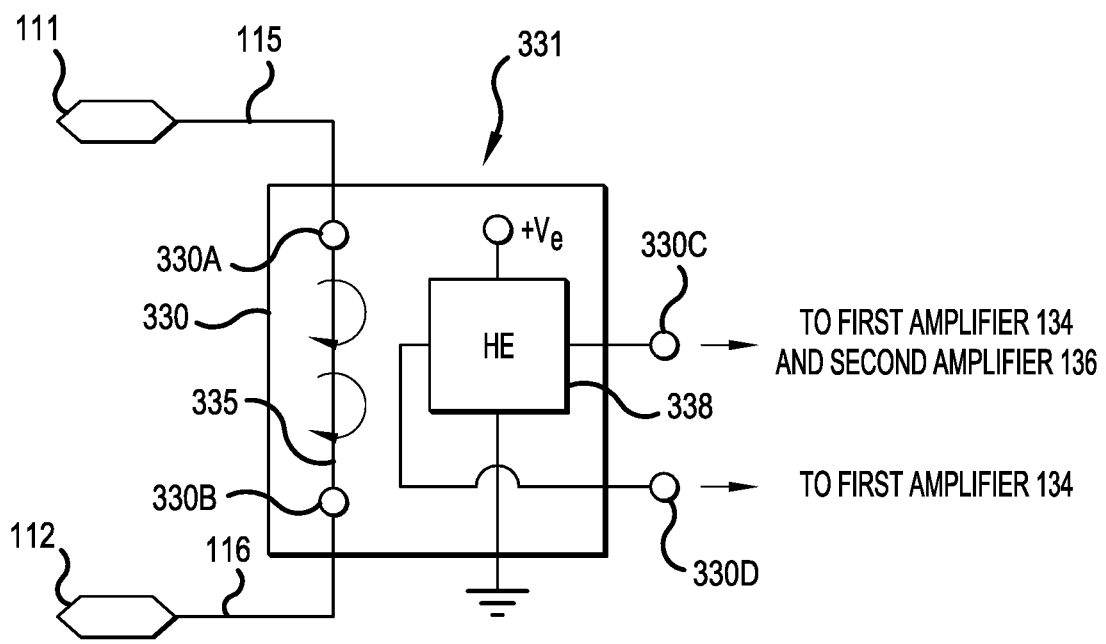
FIG. 2B is a simplified block diagram of a sensor implemented using a Hall effect sensor, according to a representative embodiment.

Referring to FIG. 2B a sensor 330 includes a Hall effect sensor 331, having a DUT current wire 335 and a magnetic field detector 338. The DUT current wire 335 is connected between first node 330A and second node 330B, and the magnetic field detector 338 is connected between third node 330C and fourth node 330D of the sensor 330 on the probe head 106. The first probe input 111 is connected to the first node 330A via the first signal lead 115, and the second probe input 112 is connected to the second node 330B via the second signal lead 116, such that current from the DUT 160 flows through the DUT current wire 335, which induces a magnetic field. The magnetic field detector 338 is configured to generate a voltage in the presence of the induced external magnetic field, where the voltage is proportional to the current from the DUT 160. A calibration curve, for example, may be used to determine the amount of current is in the DUT current wire 335 based on the voltage. The third node 330C connects to the first amplifier 134 and the second amplifier 136, and the fourth node 330D connects to the first amplifier 134, to provide detected current and detected voltage signals, as discussed above. Similarly, in an alternative configuration, a magneto-resistive sensor (not shown) incorporates a material that changes resistance in the presence of a magnetic field, which is generated in response to current from the DUT 160 similarly flowing through a DUT current wire in the magneto-resistive sensor.

As noted above, the test instrument to which the probe is connected may be an oscilloscope, a power analyzer or a spectrum analyzer, or other device capable of operation in the time domain. That is, the test instrument may collect and display of the signals received from the probe and/or calculated by the test instrument over a period of time. However, when operating in the time domain, the various signals (e.g., the detected current signals and the detected voltage signals) must be properly aligned in time to enable accurate calculations (e.g., of the power signals) and/or and processing by the test instrument. Aligning signals in time may be referred to as deskewing.

Figure 3:
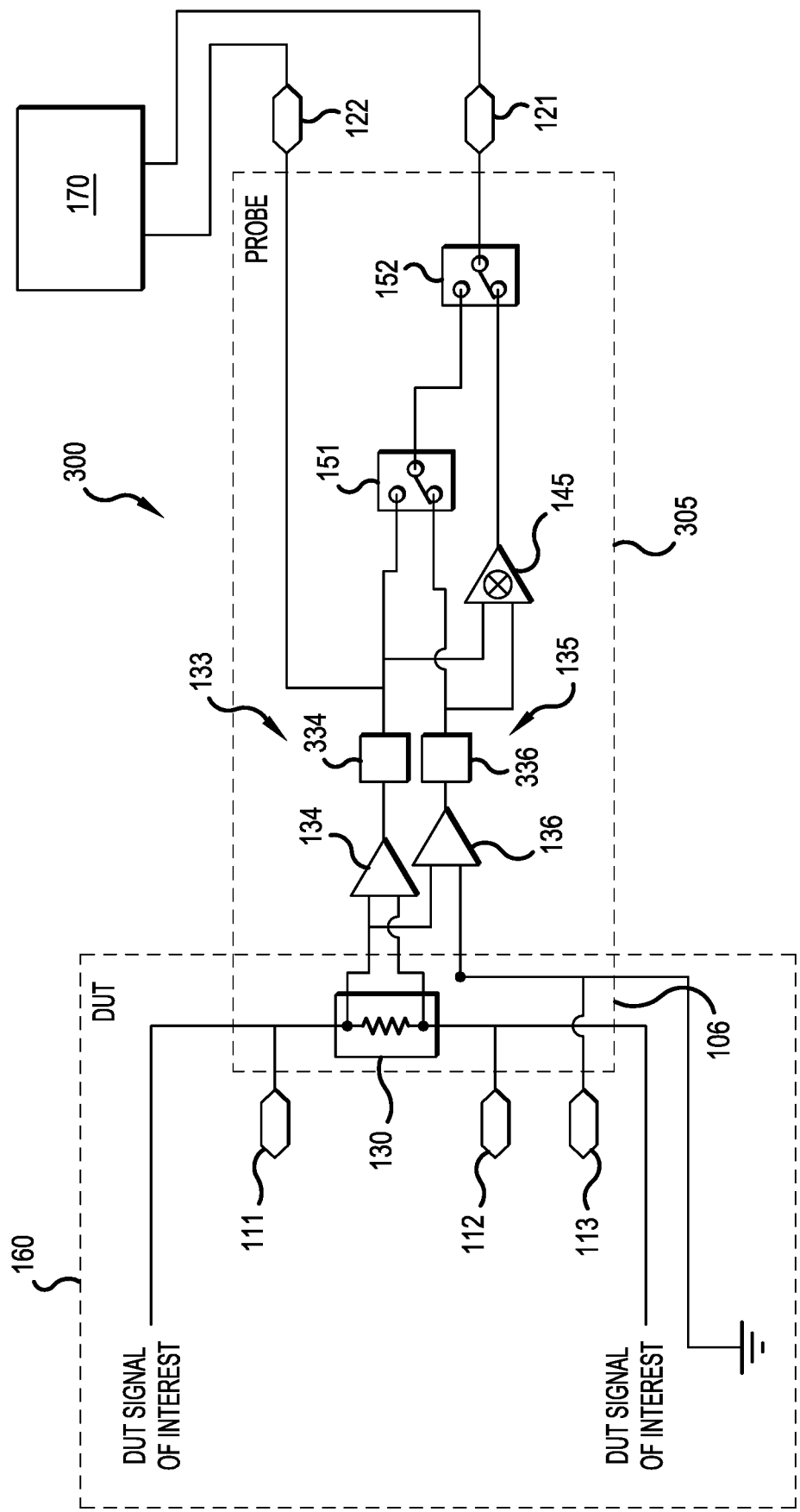
FIG. 3 is a simplified block diagram of a probe connectable to a test instrument for measuring signals of a DUT, including a deskew circuit, according to a representative embodiment.

FIG. 3 is a simplified block diagram of a probe connectable to a test instrument for measuring signals of a DUT, including a deskew circuit, according to a representative embodiment.

Referring to FIG. 3, a probe 300 is connectable between DUT 160 and test instrument 170 for measuring and displaying signals of the DUT 160 over a period of time. The probe 300 is substantially the same as the probe 100, discussed above, with the addition of a current deskew circuit 334 and a voltage deskew circuit 336 for adjusting relative timing of the detected current signal and the detected voltage signal, respectively, in order to align the detected current signal and the detected voltage signal in time.

In particular, the probe 300 includes a base 305 and probe head 106, which may be permanently connected to (integrated with) the base 305 or removably connected to the base 305, as discussed above with regard to the base 105 and the probe head 106. The base 305 includes the sensor 130, and the current detection circuit 133 and the voltage detection circuit 135 connected to the sensor 130 for providing the detected current signal and the detected voltage signal, respectively. The base 305 further includes the current deskew circuit 334 in a current path between the current detection circuit 133 and the combiner 145, and the voltage deskew circuit 336 in a voltage path between the voltage detection circuit 135 and the combiner 145. The current deskew circuit 334 is connected to the output of the first amplifier 134, and the voltage deskew circuit 336 is connected to the output of the second amplifier 136. Notably, FIG. 3 shows both the current deskew circuit 334 and the voltage deskew circuit 336, enabling timing to be adjusted in either or both of the current path and the voltage path. However, it is understood that, in alternative embodiments, only one of the current deskew circuit 334 or the voltage deskew circuit 336 may be included in the probe, in which case relative timing is adjusted using the one of the current deskew circuit 334 and the voltage deskew circuit 336, without departing from the scope of the present teachings. Delaying one or both of the detected current signal and the detected voltage signal substantially aligns them in the time domain, which reduces skew at the combiner 145.

The time adjusted detected current signal and/or detected voltage signal are combined by the combiner 145, which provides the power signal with proper time alignment. The time adjusted detected current signal and detected voltage signal are also input to the first switch 151, which is configured to select one of the detected current signal and the detected voltage signal. The output of the first switch 151 and the output of the combiner 145 are input to the second switch 152, which is configured to select one of the detected current signal/detected voltage signal from the first switch 151 and the power signal from the from the combiner 145.

The current deskew circuit 334 and/or the voltage deskew circuit 336 may be implemented using a predetermined path length differential between the current path and the voltage path. That is, during manufacturing, the path length of current path or the voltage path may be altered, e.g., to add additional line length, so that the respective path lengths are equal. In this case, the deskewing or time-alignment may be handled completely by the manufacturer when the probe 300 is built, since the lengths of the current and voltage paths are fixed for the lifetime of the probe 300.

Alternatively, each of the current deskew circuit 334 and the voltage deskew circuit 336 may be any type of tunable delay circuit, such as adjustable line lengths and programmable hardware delay components, for example. The adjustable line lengths include a set of lines having different line lengths, which may be switched in to the current path or the voltage path to provide corresponding different delays. The programmable hardware delay components may include DS1023S-50+ programmable delay lines/timing elements available from Maxim Integrated, MC100EP196FAG programmable delay lines/timing elements available from ON Semiconductor, or an HMC856LC5 IC delay line available from Analog Devices Inc., for example. The programmable delay components may be programmed/controlled by providing appropriate logic levels on programming pins, where the logic levels may be set by a processing unit (discussed above shown), for example, located in the probe 100 or in the test instrument 170. Of course, other programmable and non-programmable delay components may be incorporated without departing from the scope of the present teachings.

Inclusion of the current deskew circuit 334 and/or the voltage deskew circuit 336 simplifies the process for time-alignment/deskew of the current and voltage signals. Conventional processes for deskewing probe signals are performed by an oscilloscope or other test instrument. The processes involve connecting both current and voltage probes to a common point and running the oscilloscope through a software routine that aligns the current and voltage signals in time. It typically is very challenging to get two different types of probes connected to the common point with high enough precision required for fast measurements. In comparison, of the current deskew circuit 334 and/or the voltage deskew circuit 336 improve the accuracy and precision of the deskew process since the deskewing can be performed at the factory during manufacturing, with custom fixtures, and the probe 300 may be designed to minimize deskew. This leads to more accurate power measurements, since any misalignment in time between detected current and voltage signals would otherwise lead to errors. Also, repeatability of measurement results is improved since the current detection circuit 133 and the voltage detection circuit 135 are integrated into the same probe, and thus their positions cannot vary with respect to one another.

In an embodiment, the probe does not include switches, in which case the probe output(s) are hardwired to output one of the detected current signal, the detected voltage signal, or the power signal. An example is shown in FIG. 4, which is a simplified block diagram of a probe connectable to a test instrument for measuring signals of a DUT, with fixed outputs, according to a representative embodiment.

Figure 4:
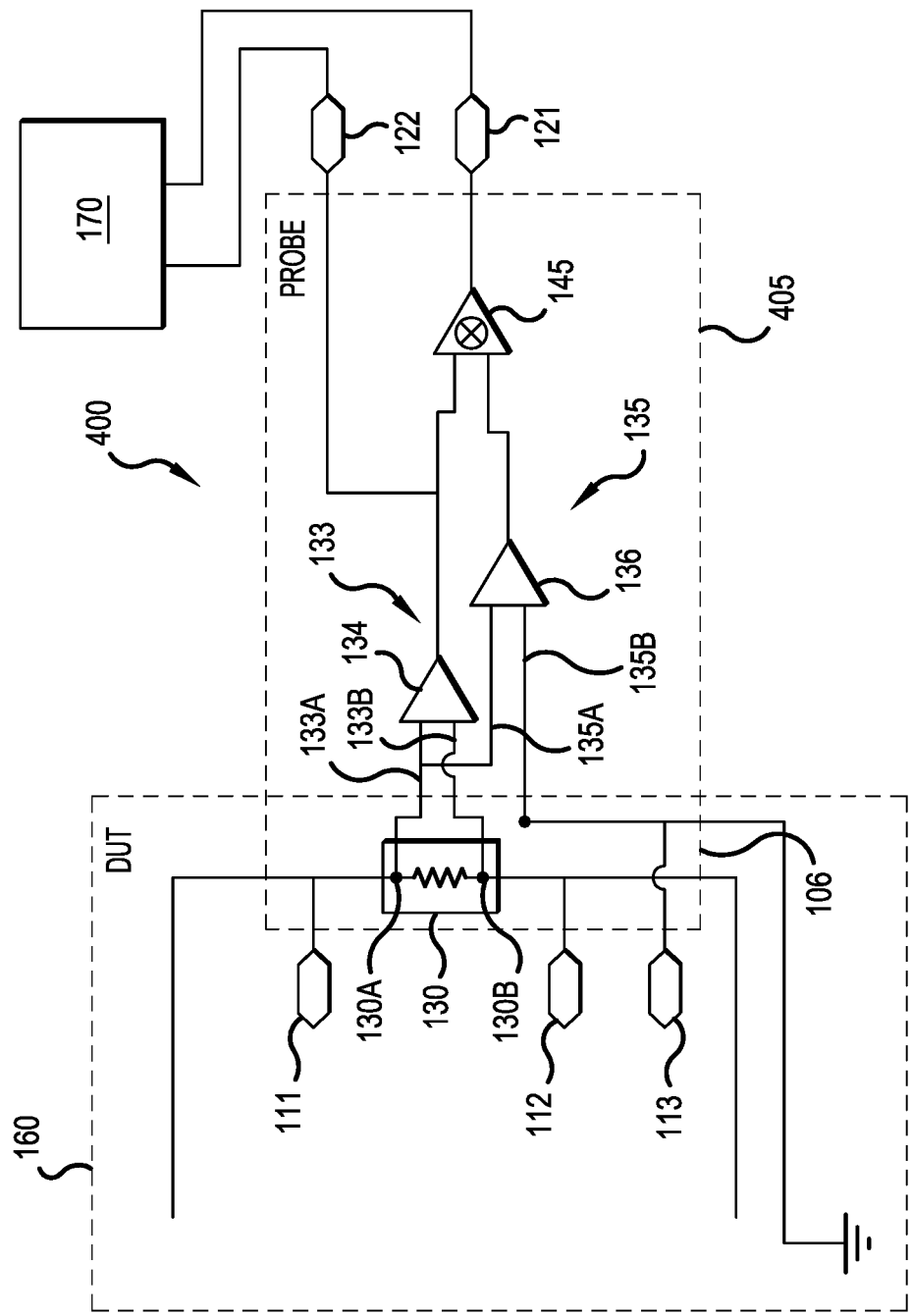
FIG. 4 is a simplified block diagram of a probe connectable to a test instrument for measuring signals of a DUT with fixed outputs, according to a representative embodiment.

Referring to FIG. 4, a probe 400 is connectable between DUT 160 and test instrument 170 for measuring and displaying signals of the DUT 160. The probe 400 is similar to the probe 100, discussed above, without the first and second switches 151 and 152. Accordingly, probe 400 is hardwired so that the output of the combiner 145 (the power signal) is provided to the first probe output 121 and the output of the first amplifier 134 (the detected current signal) is provided to the second (optional) probe output 122. In alternative embodiments, the output of the second amplifier 136 (the detected voltage signal) may be provided to the second probe output 122 instead of the output of the first amplifier 134, or the second probe output 122 may be omitted altogether, in which case the probe 400 only outputs the power signal.

In particular, the probe 400 includes a base 405 and probe head 106, which may be permanently connected to (integrated with) the base 405 or removably connected to the base 405, as discussed above with regard to the base 105 and the probe head 106. The base 405 includes the sensor 130, and the current detection circuit 133 and the voltage detection circuit 135 connected to the sensor 130 for providing the detected current signal and the detected voltage signal, respectively. The current detection circuit 133 includes the first lead 133A connected to the first node 130A of the sensor 130 and the second lead 133B connected to the second node 130B of the sensor 130 for detecting current through the resistor 131, and provide a corresponding detected current signal, as well as the first amplifier 134 for amplifying the detected current signal. Similarly, the voltage detection circuit 135 includes first lead 135A connected to the first node 130A of the sensor 130 and second lead 135B connected to ground through the third probe input 113 to detect voltage at the resistor 131 and provide a corresponding detected voltage signal, as well as second amplifier 136 amplifying the detected voltage signal. In the depicted embodiment, the output of the first amplifier 134 is connected directly (no switch in between) to the second probe output 122, which outputs the detected current signal. As mentioned above, in alternative embodiments, the output of the second amplifier 136 may be connected directly (no switch in between) to the second probe output 122, which then outputs the detected voltage signal instead of the detected current signal, or the second probe output 122 is omitted.

The base 405 further includes the combiner 145 that combines (multiplies) the detected current signal output from the current detection circuit 133 (at the output of the first amplifier 134) and the detected voltage signal output from the voltage detection circuit 135 (at the output of the second amplifier 136) to provide a power signal indicating power of the DUT 160. In the depicted embodiment, the combiner 145 is an amplifier with a first input connected to the current detection circuit 133 to receive the detected current signal, and a second input connected to the voltage detection circuit 135 to receive the detected voltage signal, although the combiner 145 may be implemented using other component(s), as discussed above. The output of the combiner 145 is connected directly (no switch in between) to the first probe output 121, which outputs the power signal. Further, features from other embodiments described herein, such as the current deskew circuit 334 and/or the voltage deskew circuit 336, may be included in the probe 400 in various configurations.

In yet another embodiment, the probe does not include the combiner (amplifier) for combining the detected current signal and the detected voltage signal, in which case the probe output(s) are configured to output one or both of the detected current signal and the detected voltage signal, which may be combined externally (e.g., by test instrument 170) to provide power. An example is shown in FIG. 5, which is a simplified block diagram of a probe connectable to a test instrument for measuring signals of a DUT, according to a representative embodiment.

Figure 5:
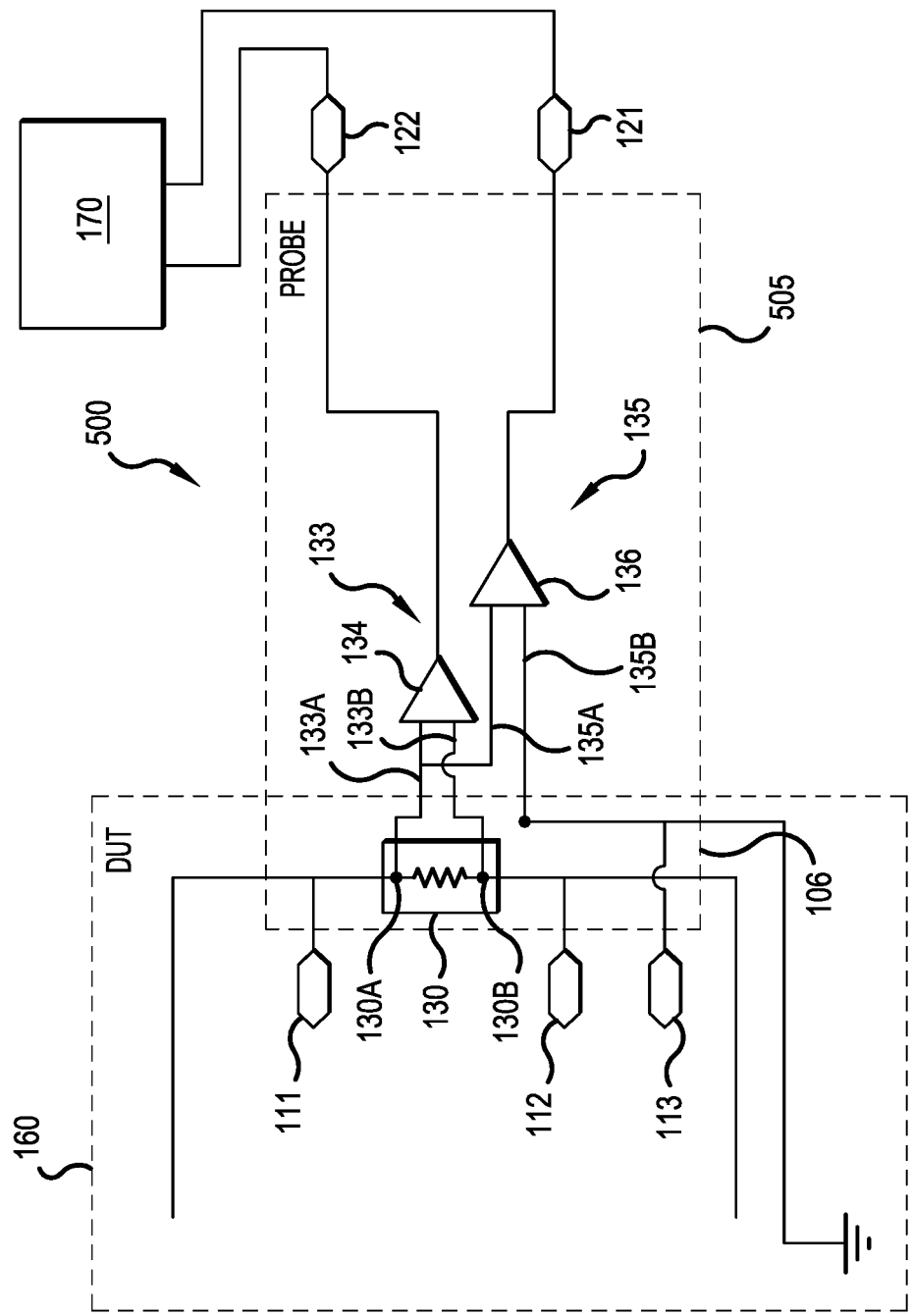
FIG. 5 is a simplified block diagram of a probe connectable to a test instrument for measuring current and voltage signals of a DUT, according to a representative embodiment.

Referring to FIG. 5, a probe 500 is connectable between DUT 160 and test instrument 170 for measuring and displaying signals of the DUT 160. The probe 500 is similar to the probe 100, discussed above, without the first and second switches 151 and 152, and without the combiner 145. Accordingly, probe 500 is hardwired so that the output of the second amplifier 136 (the detected voltage signal) is provided to the first probe output 121 and the output of the first amplifier 134 (the detected current signal) is provided to the second (optional) probe output 122. In alternative embodiments, the outputs of the first and second amplifiers 134 and 136 may be reversed, and/or the second probe output 122 may be omitted altogether, in which case the probe 500 only outputs one of the detected current signal or the detected voltage signal. When the second probe output 122 is omitted, the probe 500 may further include a switch, such as the first switch 151 in FIGS. 1 and 3, for selectively connecting one of the first and second amplifiers 134 and 136 to the first probe output 121.

More particularly, the probe 500 includes a base 505 and probe head 106, which may be permanently connected to (integrated with) the base 505 or removably connected to the base 505, as discussed above with regard to the base 105 and the probe head 106. The base 505 includes the sensor 130, and the current detection circuit 133 and the voltage detection circuit 135 connected to the sensor 130 for providing the detected current signal and the detected voltage signal, respectively. The current detection circuit 133 includes the first lead 133A connected to the first node 130A of the sensor 130 and the second lead 133B connected to the second node 130B of the sensor 130 for detecting current through the resistor 131, and provide a corresponding detected current signal, as well as the first amplifier 134 for amplifying the detected current signal. Similarly, the voltage detection circuit 135 includes first lead 135A connected to the first node 130A of the sensor 130 and second lead 135B connected to ground through the third probe input 113 to detect voltage at the resistor 131 and provide a corresponding detected voltage signal, as well as second amplifier 136 for amplifying the detected voltage signal. In the depicted embodiment, the output of the first amplifier 134 is connected to the second probe output 122, which outputs the detected current signal, and the output of the second amplifier 136 is connected to the first probe output 121, which outputs the detected voltage signal, although as mentioned above, the outputs of the first and second amplifiers 134 and 136 may be configured differently with regard to the first and/or second probe outputs 121 and 122, without departing from the scope of the present teachings. Further, features from other embodiments described herein, such as the current deskew circuit 334 and/or the voltage deskew circuit 336, may be included in the probe 500 in various configurations.

As mentioned above, the probe head may be removable connected to (separable from) the probe base, in various embodiments. For example, the probe head 106 may be separable from the base 105 in FIG. 1. This separable probe head 106 may be connected to circuitry in a DUT and left in place after being separated from the base of the probe for convenience. For example, FIG. 6A is a simplified perspective view of a probe with a separable probe head connected to a DUT, according to a representative embodiment, and FIG. 6B is a simplified perspective view of the separable probe head with a jumper cap connected to the DUT, according to a representative embodiment.

Figure 6A:
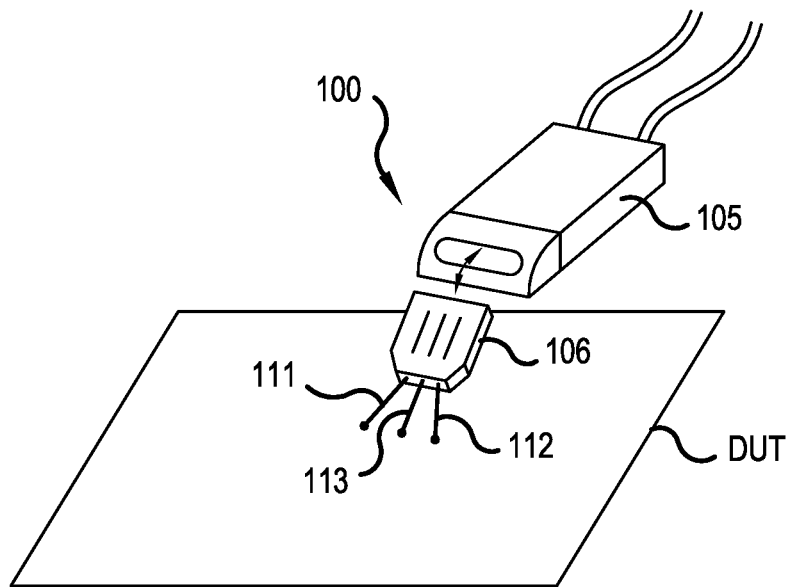
FIG. 6A is a simplified perspective view of a probe with a separable probe head connected to a DUT, according to a representative embodiment.

Referring to FIG. 6A, probe 100 includes the base 105 and the probe head 106, shown in a separated state from the base 105. The probe head 106 is connected to the DUT (e.g., DUT 160) by soldering, for example, the first and second probe inputs 111 and 112 to open ends of a broken trace in the DUT to redirect current through the probe head 106, and the third probe input 113 to DUT ground, where the trace is broken to accommodate the current and voltage measurements. The probe 100 is then able to output at least one of a detected current signal, a detected voltage signal, and a power signal, as discussed above. Of course, the probe head 106 may be removably connected various other bases having different configurations, such as the base 305 shown in FIG. 3, the base 405 shown in FIG. 4 and the base 505 shown in FIG. 5, without departing from the scope of the present teachings.

Figure 6B:
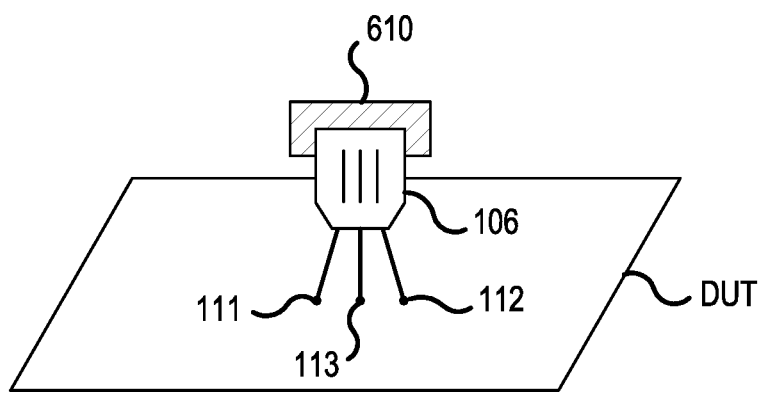
FIG. 6B is a simplified perspective view of the separable probe head and a jumper cap, according to a representative embodiment.

Referring to FIG. 6B, following current and voltage measurements and removal of the base 105, the probe head 106 may remain connected to the circuitry of the DUT. In this case, a jumper cap 510 may be connected across the probe head 106. The jumper cap 610 creates a short between the ends of the broken trace to which the first and second probe inputs 111 and 112 are connected. This re-shorts the broken trace, thus allowing the DUT to operate normally.

According to the various embodiments, probe output architecture may vary depending on user and/or functionality requirements for the probe with regard to a DUT. For example, the probe may have a single probe output connected to a single channel of the test instrument. The detected current signal and the detected voltage signal may be combined, e.g., by an amplifier, to provide a power signal. Thus, the power signal, the detected current signal and/or the detected voltage signal may be sent to the test instrument via the single probe output. This utilizes a single channel on the test instrument, and provides simple probe construction. As described above, the power signal, the detected current signal and the detected voltage signal are voltage signals corresponding to the detected or measured power, current and voltage of the DUT, respectively, which may be discrete or sampled by the test instrument over time. One or more switches may be included in the probe in order to select the one of the power signal, the detected current signal or the detected voltage signal to be output. The probe may include two probe outputs connected to two channels on the test instrument. The probe outputs may be used to output the detected current and detected voltage signals, or combinations of the detected current or voltage signals with the power signal. When the detected current and voltage signals are output, the power may be derived by the test instrument using the detected current and voltage signals.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A probe connectable to a test instrument for measuring signals of a device under test (DUT), the probe comprising:
   a probe head comprising:
      a plurality of leads configured to connect to signal probe points of the DUT; and
      a sensor connected between two leads of the plurality of leads;
   at least one probe output configured to connect to the test instrument;
   a current detection circuit configured to detect current of the DUT through the sensor, and to provide a detected current signal;
   a voltage detection circuit configured to detect voltage of the DUT between the sensor and ground, and to provide a detected voltage signal;
   a combiner configured to combine the detected current signal and the detected voltage signal, and to provide a power signal indicating power of the DUT; and
   a plurality of switches configured to selectively output at least one of the detected current signal, the detected voltage signal, and the power signal.

2. The probe of claim 1, wherein the plurality of switches comprise:
   a first switch connected to the current detection circuit and the voltage detection circuit for selecting one of the detected current signal and the detected voltage signal; and
   a second switch connected to the combiner and an output of the first switch for selecting one of the power signal or the selected one of the detected current signal or the detected voltage signal.

3. The probe of claim 2, wherein the at least one probe output comprises:
   a first probe output connected to an output the second switch for outputting the selected one of the power signal, the detected current signal or the detected voltage signal; and
   a second probe output connected to the current detection circuit or the voltage detection circuit for outputting the detected current signal or the detected voltage signal, respectively.

4. The probe of claim 1, wherein the current detection circuit comprises a first amplifier configured to amplify the detected current signal, and
wherein the voltage detection circuit comprises a second amplifier configured to amplify the detected voltage signal.

5. The probe of claim 4, wherein the combiner comprises a combining amplifier configured to combine and amplify the amplified detected current signal and the amplified detected voltage signal output by the first amplifier and the second amplifier, respectively, to output the power signal.

6. The probe of claim 5, wherein each of the first amplifier, the second amplifier, and the combining amplifier is a high bandwidth amplifier, enabling the probe to measure detected current and voltage signals having bandwidths or signal content greater than 100 MHz.

7. The probe of claim 1, wherein the detected current signal indicates current measurements of the DUT correlated with time, and the detected voltage signal indicates voltage measurements of the DUT correlated with time.

8. The probe of claim 7, further comprising:
a deskew circuit in at least one of a current path, between the current detection circuit and the combiner, or a voltage path, between the voltage detection circuit and the combiner, the deskew circuit being configured to reduce misalignment in time between the detected current signal and the detected voltage signal.

9. The probe of claim 8, wherein the deskew circuit comprises a predetermined path length differential between the current path and the voltage path.

10. The probe of claim 8, wherein the deskew circuit comprises an adjustable line length in at least one of the current path or the voltage path.

11. The probe of claim 1, wherein the plurality of leads of the probe head comprise:
a ground lead configured to connect to the ground through the DUT;
a first signal lead configured to connect to a first signal probe point of the DUT; and
a second signal lead configured to connect to a second signal probe point of the DUT, wherein the sensor is connected between the first and second signal leads.

12. The probe of claim 11, wherein the probe head is removably connected to a probe body, enabling the probe head to be selected to accommodate different geometries of the DUT and/or different performance requirements of the DUT, and
wherein the probe body includes the current detection circuit, the voltage detection circuit, the combiner, and the plurality of switches.

13. The probe of claim 1, wherein the sensor comprises at least one of a resistor, a current transformer, a Hall effect sensor, or a magneto-resistive sensor.

14. A probe system including a probe and a test instrument for measuring signals of a device under test (DUT), the probe system comprising:
a probe head of the probe comprising:
a plurality of leads configured to connect to signal probe points of the DUT; and
a sensor connected between two leads of the plurality of leads;
at least one probe output configured to connect to the probe and the test instrument;
a current detection circuit configured to detect current of the DUT through the sensor, and to provide a detected current signal;
a voltage detection circuit configured to detect voltage of the DUT between the sensor and ground, and to provide a detected voltage signal; and
a deskew circuit in at least one of a current path following the current detection circuit or a voltage path following the voltage detection circuit, the deskew circuit being configured to reduce misalignment in time between the detected current signal and the detected voltage signal.

15. The probe system of claim 14, wherein the deskew circuit comprises a predetermined path length differential between the current path and the voltage path.

16. The probe system of claim 14, further comprising:
a combiner configured to combine the detected current signal and the detected voltage signal to provide a power signal indicating power of the DUT.

17. The probe system of claim 16, further comprising:
a first switch in the probe connected to the current detection circuit and the voltage detection circuit for selecting one of the detected current signal and the detected voltage signal; and
a second switch in the probe connected to the combiner and an output of the first switch for selecting one of the power signal and the selected one of the detected current signal or the detected voltage signal.

18. The probe system of claim 16, further comprising:
a processing unit in the test instrument, including a processor and a memory storing instructions that, when executed by the processor, cause the processing unit to perform a method comprising:
receiving two of the detected current signal, the detected voltage signal and the power signal from the probe; and
calculating one of the detected current, the detected voltage or the power not received from the probe; and
selecting at least one of the detected current signal, the detected voltage signal or the power signal for display.

19. The probe system of claim 14, wherein the deskew circuit comprises an adjustable line length in at least one of the current path or the voltage path.

20. The probe system of claim 14, wherein the current detection circuit comprises a first amplifier configured to amplify the detected current signal, and
wherein the voltage detection circuit comprises a second amplifier configured to amplify the detected voltage signal.

* * * * *